(12) United States Patent
Wendler

(10) Patent No.: US 12,451,884 B2
(45) Date of Patent: Oct. 21, 2025

(54) INDUCTIVE PROXIMITY SWITCH AND METHOD OF OPERATION OF AN INDUCTIVE PROXIMITY SWITCH

(71) Applicant: Turck Holding GmbH, Halver (DE)

(72) Inventor: Torsten Wendler, Schwarzenberg (DE)

(73) Assignee: Turck Holdings GmbH, Halver (DE)

( * ) Notice: Subject to any disclaimer, the term of this patent is extended or adjusted under 35 U.S.C. 154(b) by 0 days.

(21) Appl. No.: 18/618,053

(22) Filed: Mar. 27, 2024

(65) Prior Publication Data

US 2024/0333287 A1  Oct. 3, 2024

(30) Foreign Application Priority Data

Mar. 28, 2023  (DE) .................. 10 2023 107 760.0

(51) Int. Cl.
*H03K 17/95*  (2006.01)

(52) U.S. Cl.
CPC ..... *H03K 17/9525* (2013.01); *H03K 17/9505* (2013.01)

(58) Field of Classification Search
CPC ........... H03K 17/9525; H03K 17/9505; H03K 2017/9527; H03K 17/9502;
(Continued)

(56) References Cited

U.S. PATENT DOCUMENTS

| 7,626,466 | B2 | 12/2009 | Kuehn |
| 2009/0021248 | A1 | 1/2009 | Bernard et al. |

(Continued)

FOREIGN PATENT DOCUMENTS

| DE | 3 527 650 A1 | 8/1985 |
| DE | 10 2005 001 692 A1 | 7/2006 |

(Continued)

OTHER PUBLICATIONS

Extended European Search Report issued in EP 24 165 743.6, which is a counterpart hereof, mailed Jul. 30, 2024 and English machine translation thereof.

(Continued)

*Primary Examiner* — Richard Tan
(74) *Attorney, Agent, or Firm* — Tautz & Schuhmacher LLC; Michael McCandlish; Georg Hasselmann

(57) ABSTRACT

An inductive proximity switch comprising signal oscillating circuit and a reference oscillating circuit; multiplexer circuit designed to alternately activate the signal oscillating circuit and the reference oscillating circuit; driver circuit having an oscillator designed to operate the activated signal oscillating circuit and the activated reference oscillating circuit with an oscillator frequency, respectively; detection module designed to determine a number of oscillations of the activated signal oscillating circuit measured within a predetermined gate time and a number of oscillations of the activated reference oscillating circuit measured within the predetermined gate time; and an evaluation module designed to determine a difference signal on basis of the determined number of oscillations of the activated signal oscillating circuit measured within the predetermined gate time and the determined number of oscillations of the activated reference oscillating circuit measured within the predetermined gate time, and to generate a control signal depending on the difference signal.

15 Claims, 5 Drawing Sheets

(58) Field of Classification Search
CPC ........... H03K 17/9545; H03K 17/9517; H03K 17/952; H03K 17/953
USPC ........................................................ 307/116
See application file for complete search history.

(56) References Cited

U.S. PATENT DOCUMENTS

2010/0225332 A1    9/2010  Niwa et al.
2022/0074729 A1*   3/2022  Peter .................... H03K 17/952

FOREIGN PATENT DOCUMENTS

DE    10 2013 202 573 B3      4/2014
DE    10 2017 128 472 A1      6/2019
EP            3016284    *    5/2016
EP            4125215    *    2/2023

OTHER PUBLICATIONS

German Search Report issued in DE 10 2023 107 760.0 , to which this application claims priority, mailed Mar. 13, 2024 and English machine translation thereof.

* cited by examiner

INDUCTIVE PROXIMITY SWITCH AND METHOD OF OPERATION OF AN INDUCTIVE PROXIMITY SWITCH

CROSS REFERENCE TO RELATED APPLICATIONS

This application claims priority to German patent application DE 10 2023 107 760.0 filed on Mar. 28, 2023, which is hereby incorporated by reference in its entirety.

TECHNICAL FIELD

The present disclosure relates to an inductive proximity switch and optionally to a method for operating an inductive proximity switch.

BACKGROUND

Inductive proximity switches in general are known from the related art. In order to detect the intrusion of a target into a detection zone, a high-frequency electromagnetic field is generated and the influence of the target on this field is determined.

The change of the field may depend on various factors, for example on the position of the target in the detection zone, on the electrical and magnetic material properties of the target, and on the mass of the target in the detection zone.

In the case of a specific target, it is possible on the basis of the change of the field to draw a conclusion about a specific position of the target, particularly about a specific distance from a defined starting point, for example from the coil of an oscillating circuit for generating the electromagnetic field.

Various environmental parameters can have a considerable influence on the measurement and the function of the proximity switch. In particular, the oscillation properties of oscillating circuits and the electrical properties of the components used change. Especially in the case of high switching distances, the change of the useful signal as the target approaches may lie in the order of magnitude of the effects caused by temperature change. Various methods have been proposed for compensating these effects.

In DE 10 2005 001 692 A1, it is proposed to provide a controllable oscillator amplifier and a temperature sensor, so temperature-induced variations of the oscillator properties can be compensated.

In the method of DE 3 527 650 A1, a temperature-dependent current source is provided to compensate the temperature drift of a transistor of an amplifier stage and to keep the alternating current amplification of the circuit arrangement constant.

An inductive proximity switch is known from DE 10 2017 128 472 A1, in which the inductance of an oscillating circuit coil is measured and adjustments for temperature compensation are carried out accordingly.

DE 10 2013 202 573 B3 proposes using the measurement of the copper resistance of the oscillator coil for measuring the temperature and to correct a switching threshold on the basis of this measured value. As a result, the switching distance of the proximity switch is stabilized with respect to temperature fluctuations.

In US 2010/0225332 A1, the temperature compensation takes place on the basis of a circuit for temperature measurement and a signal processing circuit which is connected downstream.

It is common to the known methods that they often represent considerable additional circuit outlay.

SUMMARY

It is an object of the present disclosure to provide an inductive proximity sensor, in which the influences of environmental parameters such as temperature can be compensated easily and with as little outlay as possible.

An inductive proximity switch is provided. The inductive proximity switch comprises a signal oscillating circuit and a reference oscillating circuit and also a multiplexer circuit for alternate activation of the signal oscillating circuit or the reference oscillating circuit. The proximity switch further comprises a driver circuit having an oscillator for operating the activated signal oscillating circuit or reference oscillating circuit with an oscillator frequency, a detection module for detecting an oscillation parameter of the activated signal oscillating circuit or reference oscillating circuit and an evaluation module which is set up to determine a difference signal on the basis of the oscillation parameter for the activated signal oscillating circuit and the oscillation parameter for the activated reference oscillating circuit and to generate a control signal depending on the difference signal. In this case, the signal oscillating circuit is designed such that the oscillation parameter depends on a position of a target in a detection zone. Further, the reference oscillating circuit is designed such that the oscillation parameter is essentially independent of the position of the target in the detection zone.

Optionally, the generated switch signal is output and for example transmitted to a control unit which then carries out a control depending on the switch signal.

The disclosure is based, inter alia, on the discovery that the differential principle enables a particularly simple and robustly applicable compensation of disturbances.

Optionally, the target or target object is an object which is formed at least partly from metal or comprises a metallic element. An object of this type can—because it influences the electromagnetic field of the signal oscillating circuit—be detected by means of the inductive proximity detection.

The dependence of the oscillation parameter of the signal oscillating circuit on the "position" of the target in the detection zone is understood such that the oscillation parameter of the signal oscillating circuit differs depending on whether the target is located in the detection zone or not. Furthermore, the oscillation parameter can be influenced not only by the presence of the target in the detection zone, but rather by its distance from a specific reference point, for example the position of the signal coil, so that, conversely, the distance can be determined on the basis of the oscillation parameter. In addition, the oscillation parameter of the signal oscillating circuit may depend on the position and/or location of the target in space.

Optionally, on the basis of the oscillation parameter, it is possible to determine a change of the position and/or location of the target, for example an intrusion of the target into the detection zone or leaving the same.

The signal oscillating circuit may comprise a signal coil and the reference oscillating circuit comprises a reference coil.

The signal coil is designed such that the magnetic field of the coil generated in connection with the signal oscillating circuit has a much larger range than the magnetic field of the reference coil in connection with the reference oscillating circuit. The range of the transmit coil in this case depends on the coil diameter and the number of turns and thus determines the detection zone of the sensor. The reference coil is by contrast optionally realized such that the resultant magnetic field cancels itself out and thus the detection zone is minimized. "Range" may for example be understood to mean the field area of the coil, the intrusion of a target into which causes a measurable change of the oscillation parameter. The range of the signal oscillating circuit optionally comprises the detection zone, while the range of the reference oscillating circuit does not reach as far as the detection zone.

Optionally, in this case, the signal coil and the reference coil are designed with essentially the same inductance. The signal oscillating circuit and the reference oscillating circuit optionally have the same natural frequency as long as they are operated using the coils and the same capacitance.

Unlike the signal oscillating circuit, the reference oscillating circuit is in practice not influenced by the target in the detection zone. However, the environmental parameters, such as temperature changes or electromagnetic interferences act on the two coils in the same way. That is to say a measurement by means of the reference oscillating circuit primarily allows assertions about the influencing of the oscillation parameter by the environmental parameters, independently of the position of the target in the detection zone.

The multiplexer circuit may be set up to activate the signal oscillating circuit to turn on a connection, so that a capacitor and the signal coil form the signal oscillating circuit, and to activate the reference oscillating circuit to turn on a connection, so that the capacitor and the reference coil form the reference oscillating circuit. In this case, the respectively other connection may not be turned on, i.e., is optionally turned off.

In this case, the same capacitor is typically used for both oscillating circuits, that is to say in each case together with the signal or reference coil. As a result, no differing oscillation properties are created due to different capacitors in the signal and reference oscillating circuits.

In the proximity switch, it is always only one of the two oscillating circuits that is operated, as both at the same time would cause interference. The multiplexer circuit is optionally set up to ensure that the two oscillating circuits are activated alternately and not simultaneously.

An operational amplifier may be provided, which is arranged downstream of the driver circuit and upstream of the detection module. This may be used to amplify the pulses of the detected oscillation prior to detection and process the pulses for the downstream detection module.

The signal and reference coils are optionally designed as planar coils which can for example be produced by a printed circuit board process or by printing.

The signal coil may be designed as a cylindrically wound coil. As a result, with the signal coil in a signal oscillating circuit, a directed high-frequency electromagnetic field can advantageously be generated. The signal coil is designed such that using it, an electromagnetic field can be generated such that its range and thus its detection zone is designed to be as large as possible and, upon intrusion of a target material, causes a measurable change of an oscillation parameter, for example the oscillation frequency.

The reference coil may have a plurality of sub-windings, optionally four sub-windings or a whole-number multiple of four sub-windings, wherein the sub-windings are designed in a counter-wound manner with respect to one another. At least, an even number of sub-windings may be provided, which sub-windings are designed in a counter-wound manner with respect to one another. The design with an integer or whole-number multiple of four partial windings may cause a good minimization of the outwardly effective magnetic field due to the symmetry, especially with the same inductance as the signal resonant circuit or its detection coil.

Four sub-windings can be arranged as "quadrants", that is to say in four substantially equally sized sectors.

Optionally, in each case two sub-windings which are arranged next to one another are designed in a counter-wound manner. Due to the counter-wound design, the current in the sub-windings respectively flows in the reverse direction and the induced magnetic fields are opposed.

The counter-wound sub-windings may be designed and/or arranged such that the high-frequency fields that can be generated by the sub-windings substantially cancel themselves out in the activated reference oscillating circuit. The sub-windings that are designed in a counter-wound manner are optionally designed such that they have essentially the same inductance. As a result, the electromagnetic fields induced by the sub-windings cancel each other out.

Optionally, due to the design of the reference coil, a small range of the resultant field of the reference oscillating circuit is achieved. For example, the range of the reference oscillating circuit is at most 10%, typically at most 5% of the range of the signal oscillating circuit.

The signal coil and the reference coil may be designed to be flat and arranged in layers above one another. The coils can optionally be printed in layers that are arranged above one another.

There may be at least one grid layer having the signal coil and the reference coil arranged above one another. Optionally, in this case, the grid layer is set up for shielding in the sense of electromagnetic compatibility (EMC) of the inductive proximity switch.

Grid lines may run in such a way that they intersect the coil windings of the signal coil and/or the reference coil at right angles in a projection.

Optionally, two grid layers are provided, between which the signal coil and the reference coil are arranged; in this case, a first grid layer is arranged above the signal coil and the reference coil and a second grid layer is arranged below the signal coil and the reference coil. This grid structure is optionally not self-contained and it is typically attached to the circuit ground.

The oscillation parameter may relate to a frequency and/or amplitude of the activated oscillating circuit. For example, the detection unit may be set up to determine a number of oscillations of the activated oscillating circuit measured within a predetermined gate time. Optionally, the frequency can be determined on the basis of the counted oscillations and the predetermined gate time.

Therefore, it can be determined by the detection unit how the frequency—optionally the natural frequency—changes, as oscillation parameter of the respectively activated signal oscillating circuit or reference oscillating circuit, in the case of influence due to the target in the detection zone.

The longer the predetermined gate time, the more precisely the frequency of the activated oscillating circuit can be determined. Therefore, the better the spatial resolution is and the poorer the temporal resolution is during the measurement. Conversely, an improved temporal resolution can be obtained by a shorter gate time, wherein the frequency is then determined less precisely and therefore the spatial resolution of the measurement is less precise. This means that in the case of a long gate time, the measurement is more precise, but the measurement result and therefore the output signal of the sensor is available a longer time later than in the case of a shorter gate time; thus there is a later reaction to the intrusion of the target into the detection zone.

The difference signal may be determined by the evaluation module in that a difference is formed on the basis of the number of oscillations inside the gate time with activated signal coil and reference coil. This corresponds optionally to a determination of the difference of the frequencies of the signal coil and reference coil.

The thus-determined difference signal can therefore be considered as a compensated measurement signal. As the environmental parameters such as for example the temperature essentially affect the signal coil and the reference coil in the same way, only changes to the frequency that are caused by the target in the detection zone of the signal oscillating circuit are considered as difference signal.

An amplitude of the signal can be detected as oscillation parameter; a damping of the signal by a target arranged in the detection zone is measured optionally in this case. The determination of the difference signal then may take place, analogously to the above-explained procedure, such that only the portion of the damping caused by the position of the target in the detection zone is evaluated, without the effect of interferences due to environmental parameters.

The evaluation module generates a control signal on the basis of the difference signal. For example, a threshold value may be predetermined, with a switch signal being triggered when a value exceeds and/or falls below the threshold value. Optionally, the threshold value in this case corresponds to a specific position of the target in the detection zone, for example a specific distance from a reference point.

The control signal may also include an output of a measured value for the oscillation parameter or the difference signal. On the basis of the thus-output measured value, it may be possible for example to determine the position of the target.

In the method for operating an inductive proximity switch using a signal oscillating circuit and a reference oscillating circuit, a signal oscillating circuit and a reference oscillating circuit are activated alternately. An oscillation parameter is detected for the signal oscillating circuit and for the reference oscillating circuit, respectively, and a difference signal is determined on the basis of the detected values of the oscillation parameter. That is, a first value of an oscillation parameter is detected for the signal oscillating circuit and a second value of the oscillation parameter is detected for the reference oscillating circuit. A difference signal is determined on the basis of the detected first and second values of the oscillation parameter. In this case, the signal oscillating circuit is designed such that the oscillation parameter, i.e., the first value thereof, depends on a position of a target in a detection zone and the reference oscillating circuit is designed such that the oscillation parameter, i.e., the second value thereof, is essentially independent of the position of the target in the detection zone.

The method is primarily set up to operate the inductive proximity switch according to the present description. The method therefore has the same advantages as the proximity switch.

BRIEF DESCRIPTION OF THE DRAWINGS

Further details and advantages of the disclosure shall now be explained on the basis of an example which is illustrated in the drawings, wherein.

DESCRIPTION OF EXEMPLARY EMBODIMENTS

Figure 1B:
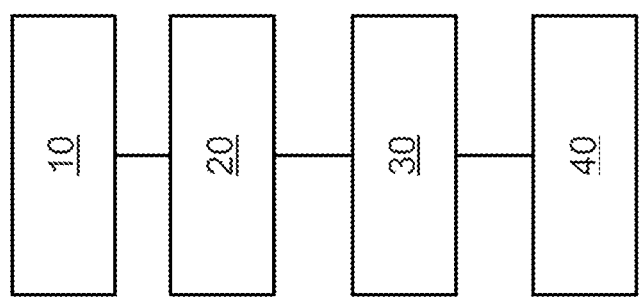
FIG. 1B shows an example of the method for operating the proximity switch.
Figure 1A:
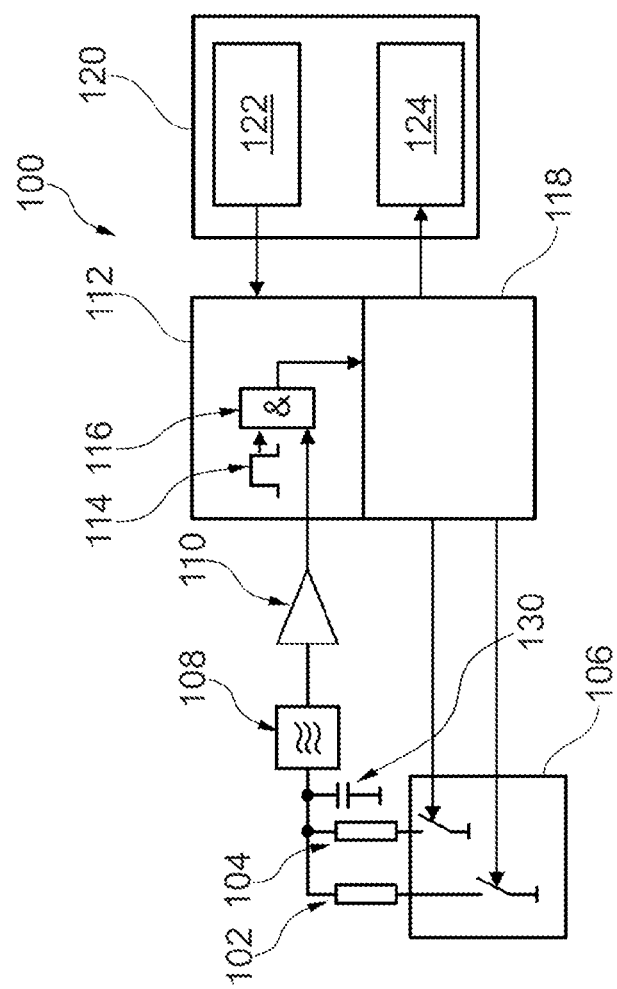
FIG. 1A shows a schematic illustration of an exemplary embodiment of the proximity switch.

With reference to FIGS. 1A and 1B, a schematic illustration of an example of the proximity switch and a method for its operation are explained. The example should not be construed as limiting the disclosure to that particular example, but should rather be understood as one out of many possible ways to implement the disclosure.

The inductive proximity switch 100 comprises a signal coil 102 and a reference coil 104. In this example, the two coils 102, 104 are designed with essentially the same inductance.

The signal coil 102 is designed such that an electromagnetic field generated using it in a signal oscillating circuit has a range that includes at least one detection zone 126. If a target 128, particularly made from a metallic material, intrudes into the detection zone 126, then the oscillation properties of the signal oscillating circuit change and on the basis of the change, the position of the target 128 can be detected.

The reference coil 104 is by contrast designed such that an electromagnetic field generated using it in a reference oscillating circuit has a distinctly shorter range that optionally does not reach as far as the detection zone 126. A target 128 in the detection zone 126 therefore does not change the oscillation properties of the reference oscillating circuit.

In the exemplary embodiment, these properties are maintained inter alia by suitable windings of the coils 102, 104. The differences in the winding of the signal coil 102 and the reference coil 104 are explained in more detail below.

The signal coil 102 and the reference coil 104 are arranged together such that they are essentially exposed to the same environmental parameters, such as air or external fields.

A multiplexer circuit 106 is connected upstream of the signal coil 102 and the reference coil 104. This multiplexer circuit is set up to always activate precisely one coil 102, 104, in order to exclude mutual influencing of signal coil 102 and reference coil 104 in the case of simultaneous operation.

A capacitor 130 having a specific capacitance is further provided, which is connected downstream of the signal coil 102 and the reference coil 104. Depending on which coil 102, 104 is activated, the capacitor 130 together with the activated coil forms a signal oscillating circuit or a reference oscillating circuit. In further exemplary embodiments, it may be provided that the signal oscillating circuit and the reference oscillating circuit are designed with their own capacitors in each case.

If the signal coil 102 is connected to the capacitor 130, then a signal oscillating circuit is activated thereby.

If the reference coil 104 is connected to the capacitor 130, then a reference oscillating circuit is activated thereby.

Due to the alternate activation of the signal oscillating circuit or reference oscillating circuit, it is ensured that there is no mutual interference.

A driver circuit 108, particularly a differential oscillator 108 is provided and set up to operate the activated oscillating circuit, wherein in this example the signal coil 102 or reference coil 104 are operated with approximately identical natural frequencies.

In this case, in the exemplary embodiment, the signal coil 102 and the reference coil 104 are combined on a planar printed circuit board as a PCB coil (PCB=printed circuit board). They are typically produced by a printing method.

An operational amplifier 110 or comparator is arranged such that it adapts the oscillations of the respectively activated oscillating circuit to the detection module 112.

The oscillations are received at a microcontroller 112 as input signal. There, a signal, which is illustrated as a square wave signal 114 and defines a gate time, is multiplied by the received input signal by means of a logical AND operation 116.

The gate time defines a time interval in which the received input signal is evaluated.

In an evaluation module 118 that is designed as an arithmetic-logic unit, the oscillations or amplitudes occurring inside the gate time in the exemplary embodiment are counted. This gives the actual frequency of the activated oscillating circuit.

As an alternative or in addition to frequency evaluation, an evaluation can be carried out using the amplitude at lower oscillation frequencies. When a (optionally metallic) target approaches, energy is drawn from the oscillating circuit and the amplitude of the signal or detection coil becomes smaller. This does not apply to the reference coil, as the magnetic field thereof is not influenced by the target. The amplitude detected by the reference coil remains constant. Therefore, an evaluable measured value can also be generated from the difference between the two amplitude signals.

The value determined in the evaluation is stored.

In the exemplary embodiment, the detection module 112 and the evaluation module 118 are integrated in a common microcontroller. This microcontroller is supplied via a voltage regulator 122. The output of the switch signal takes place via an output driver 124. The voltage regulator 122 and the output driver 124 are integrated in a control unit 120 that is connected to the microcontroller.

In the method, initially in a step 10, one of the two coils 102, 104 and therefore the corresponding oscillating circuit is activated. For example, initially the signal coil 102 is activated, which forms a signal oscillating circuit with the capacitor 130.

The activated signal oscillating circuit is operated at least until input signals of the oscillations across the interval of the gate time 114 have been detected at the detection module 112. The evaluation module 118 counts the oscillations inside the gate time and stores this first value.

Subsequently, in a step 20, the other oscillating circuit is activated, that is to say in the exemplary case the reference oscillating circuit having the reference coil 104. This reference oscillating circuit is operated at least until input signals of the oscillations across the interval of the gate time 114 have been detected at the detection module 112. The evaluation module 120 counts the oscillations inside the gate time and also stores this second value.

In a step 30, a difference signal is determined at the evaluation module 120 on the basis of the first and the second value. In the present example, this difference signal is a difference of the first and second values. It therefore gives a measure for the difference between the frequency of the signal oscillating circuit and the frequency of the reference oscillating circuit.

On the basis of the difference signal, a comparison with a predetermined threshold value is carried out in step 40. If the difference of the first and the second values exceeds the threshold value, then a control signal is output. The predetermined threshold value corresponds optionally to a difference between the first and second values, that is to say a difference of the frequencies of the signal oscillating circuit and reference oscillating circuit at which a presence of the target 128 in the detection zone 126 is assumed.

Furthermore, the threshold value can be formed such that it corresponds to a specific distance between a reference position, such as for example the position of the signal coil 102, and the target 128.

If a value falls below or exceeds the predetermined threshold value, the control signal that is output may comprise information about whether the target 128 is leaving or intruding into the detection zone 126. To this end, a temporal change of the difference signal in successive measurements can optionally be taken into account.

The control signal may further comprise a measured value, for example the difference signal or a value of the above-explained difference between the first and the second value. The measured value may further comprise a measure for the distance of the target 128 from the signal coil 102 or the value of the distance itself. In this case, the proximity switch may not only be used for binary switching depending on the position of the target 128, but rather the detected distance can be evaluated.

In the present example of the method, the frequency of the oscillating circuits is the oscillation parameter of the two oscillating circuits that is used for evaluation. The frequency changes under the influence of the environmental parameters, such as temperature and also in the case of the signal oscillating circuit due to the position of the target 128 in the detection zone 126.

The vibration parameter of the signal coil 102 depends on environmental influences, such as the temperature, and on the target position. In the case of the reference coil 104 by contrast, only environmental influences are detected, as they are in practice not influenced by the target position. The frequencies of the alternately activated coils 102, 104 or the associated oscillating circuits are detected over a fixed gate time in the microcontroller 112 and at the detection module 118 by counting the incoming pulses. After forming the difference of the two signals, the thus-created measurement signal is compared with a taught switching point. The taught switching point corresponds to a difference signal that is measured when the target 128 is located in a switching-distance position relative to the signal coil 102 or in the detection zone 126. When the switching point is reached, the output signal of the proximity switch is updated.

The signal deviation is in this case dependent on the distance of the target and on the length of the gate time. This means that great sensitivity of the proximity switch is obtained in the case of a long gate time and the detection can be carried out at a long range; however, the switching frequency of the sensor is then low.

An exemplary embodiment of the design of a coil arrangement of the proximity switch is explained with reference to FIGS. 2, 3A, 3B, 4A, 4B, and 5. The coils shown are designed as six-layer planar coils and arranged above one another. The production can optionally take place by means of a printing method.

Figure 2:
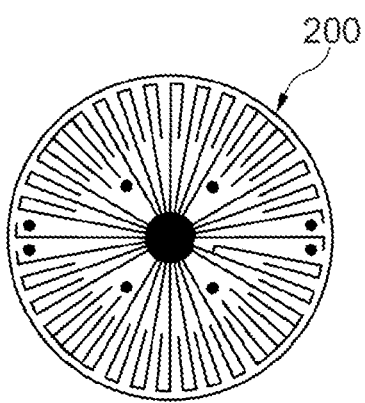
FIG. 2 shows a first shield grid.
Figure 5:
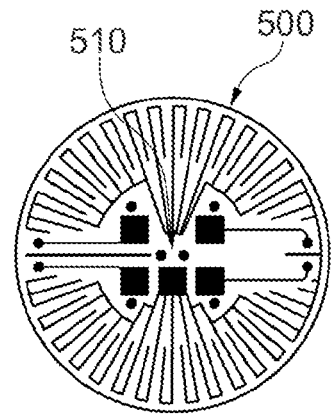
FIG. 5 shows a further shield grid with coil terminals.

As upper and lower termination of the coil arrangement, the shield grid 200 shown in FIG. 2 and the shield grid 500 shown in FIG. 5 having terminals for the coils 300, 400 arranged therebetween are respectively provided. For the shield grids, it is further provided that these shield grids are connected to the circuit ground, wherein a terminal 510 is indicated in FIG. 5. As a result, a good EMC behavior of the coil arrangement is achieved.

Figure 3A:
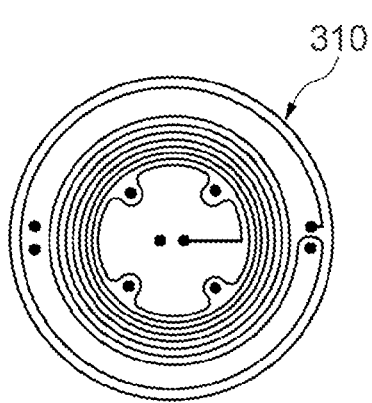
FIGS. 3A and 3B show the front and rear side of an exemplary embodiment of a signal coil, respectively.
Figure 3B:
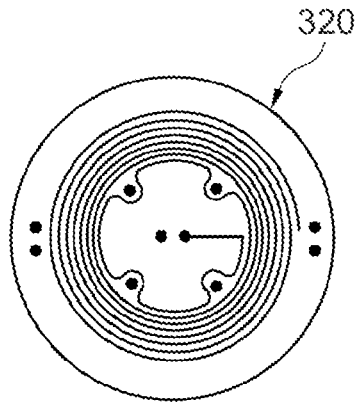

In FIG. 3A, a front side 310 of the signal coil is shown in a plan view from above, in FIG. 3B, a rear side of the signal coil is shown in a view from below.

Figure 4A:
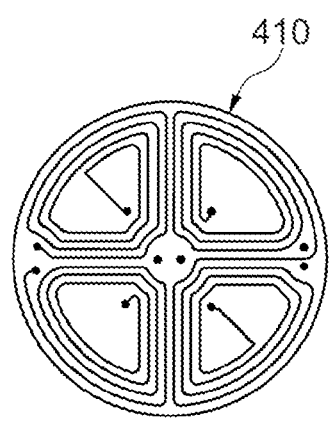
FIGS. 4A and 4B show the front and rear side of an exemplary embodiment of a reference coil, respectively.
Figure 4B:
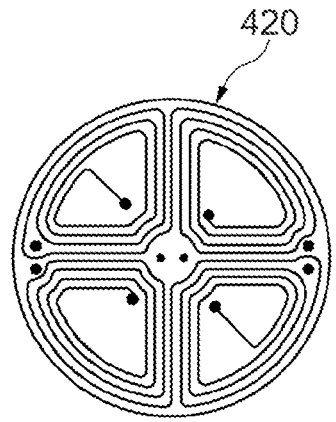

In FIG. 4A, a front side 410 of the reference coil is shown in a plan view from above, in FIG. 4B, a rear side of the reference coil is shown in a view from below.

Figure 6A:
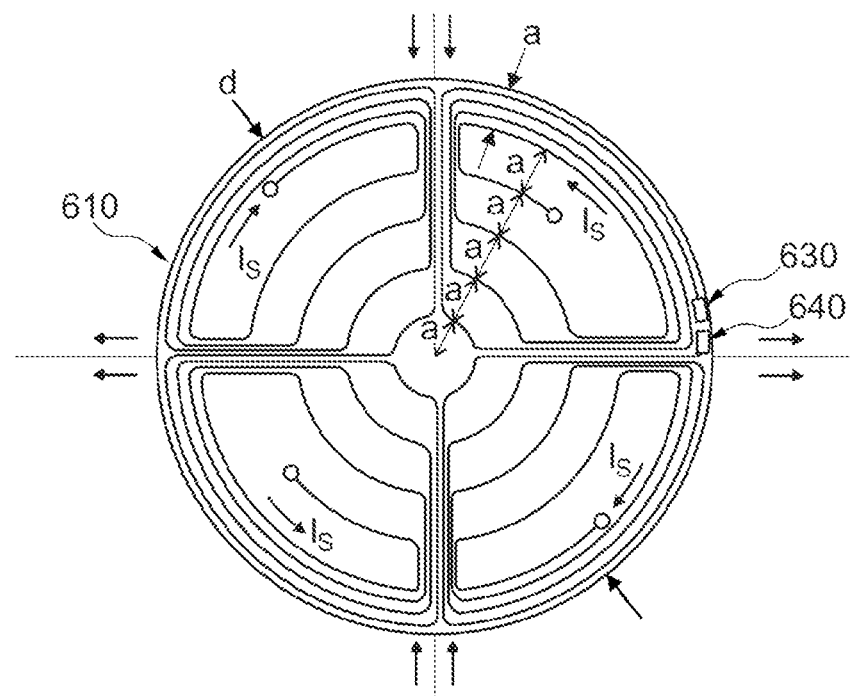
FIGS. 6A and 6B show the front and rear side of a further exemplary embodiment of a reference coil, respectively.
Figure 6B:
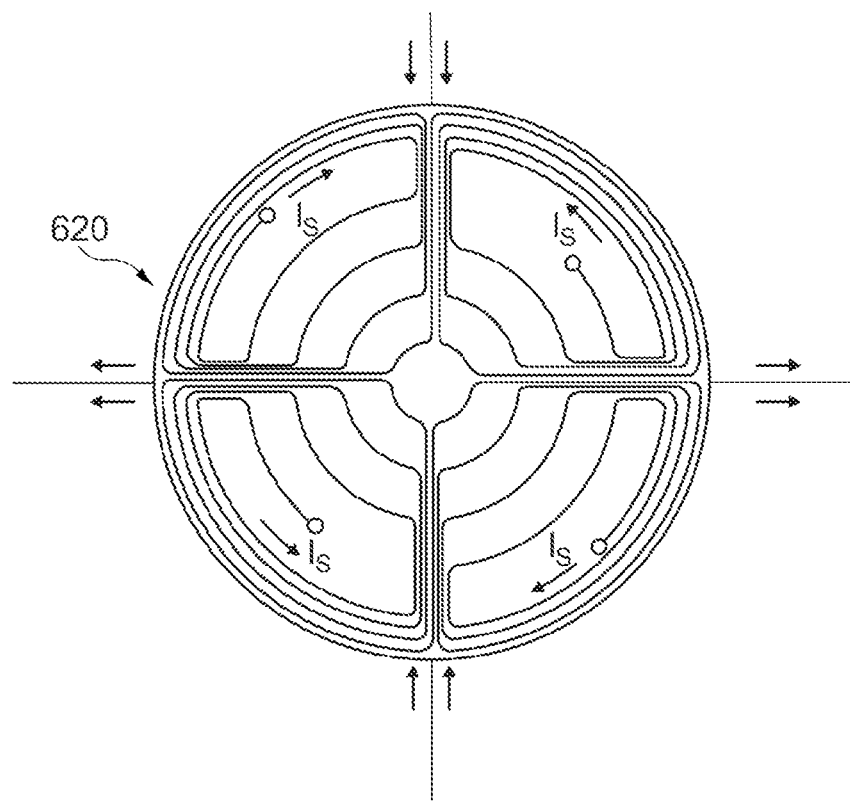

The winding of an exemplary embodiment of the reference coil is explained with reference to FIGS. 6A and 6B.

The entire winding has a substantially circular shape with a diameter d or it is arranged on a printed circuit board with the diameter d. Inside this shape, four quadrants are formed, wherein the windings of adjacent quadrants are respectively designed in a counter-wound manner with respect to one another.

A coil input 630 and a coil output 640 are provided for the electrical terminals of the reference coil.

The windings have concentric sections in the inner region which are arranged at a distance a from one another. In this case, in the example, the distance a is a twelfth of the diameter d of the printed circuit board:

$$a = \frac{d}{12}$$

Arrows indicate the respective current direction, which is also labeled with the reference symbol $I_S$. In this case, it is indicated on the basis of the arrow directions that the currents in the windings of the respectively adjacent quadrants run in opposite directions, particularly in opposite directions in the tangential direction.

In further exemplary embodiments, the reference coil can be designed, instead of with four quadrants, with a different number of sectors, wherein this number is an even number, typically a whole number multiple of 4.

Figure 7A:
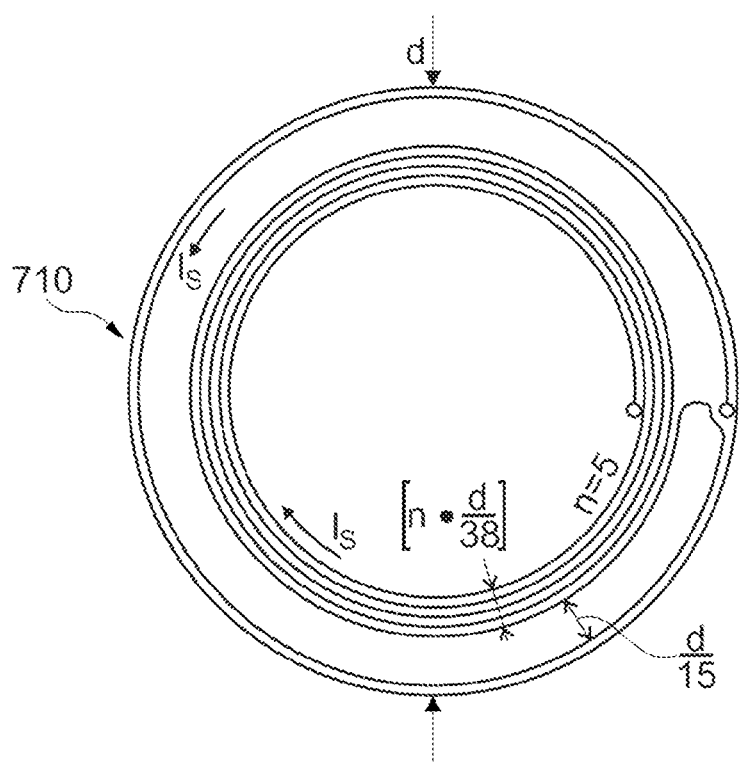
FIGS. 7A and 7B show the front and rear side of a further exemplary embodiment of a signal coil, respectively.
Figure 7B:
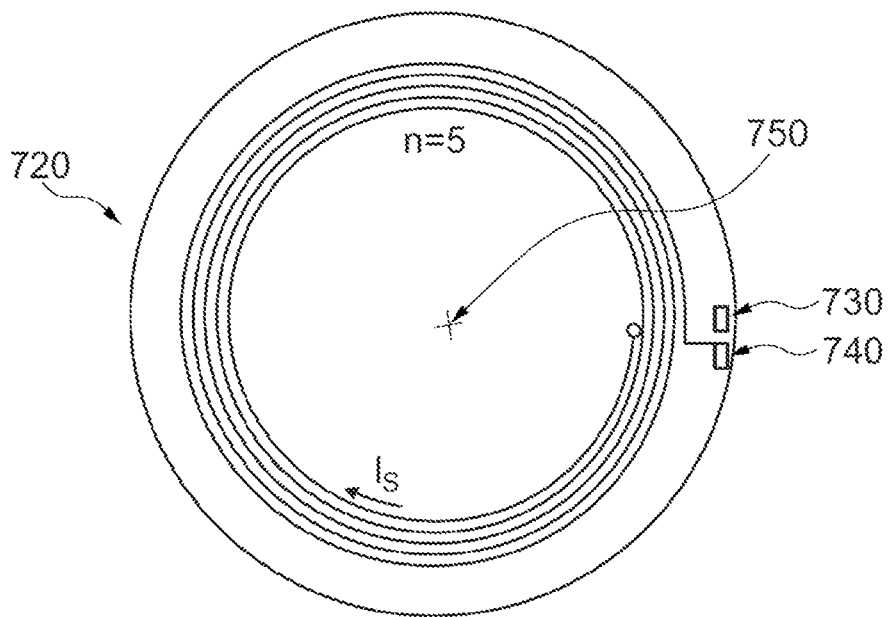

The winding of an exemplary embodiment of the signal coil is explained with reference to FIGS. 7A and 7B.

The entire winding has a substantially circular shape with a diameter d or it is arranged on a printed circuit board with the diameter d.

The winding is designed a as classic cylindrical or concentric winding.

A coil input 730 and a coil output 740 are provided for the electrical terminals of the signal coil.

Further, the geometric center point 750 of the exemplary winding shown is indicated.

In the example, the winding has a circumferentially formed section and n=5 inner windings. The distance between the circumferential section and the inner windings is $$\frac{d}{15}$$

and the distances between the inner windings in the example are $$\frac{d}{38},$$

so a number of turns n gives a width of the inner windings of $$n\frac{d}{38}.$$

Here also, arrows labeled with the reference symbol $I_S$ indicate the respective current direction.

In this case, it is indicated on the basis of the arrow directions that the current in the outer region runs in the opposite direction to the inner windings.

This winding makes it possible with the signal coil in a signal oscillating circuit to generate a directed electromagnetic field.

The inductances of the signal coil and the reference coil should be approximately equal.

Figure 8:
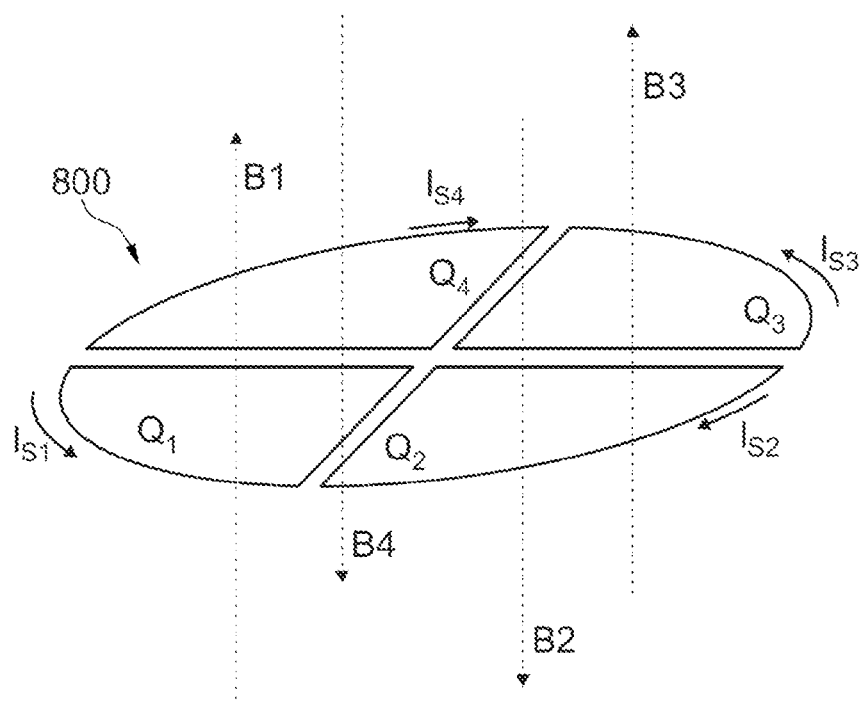
FIG. 8 shows a schematic illustration of the electric currents and the magnetic fields in the reference coil of the further exemplary embodiment.

With reference to FIG. 8, the functionality of the arrangement of turns of the reference coil 800 is explained in more detail. In this case, reference is made in particular to the reference coil explained above with reference to FIGS. 6A and 6B.

Due to the opposite direction of winding of the mutually adjacent quadrants Q1 to Q4, the current directions $I_{S1}$ to $I_{S4}$ are opposite to one another in the tangential direction. The magnetic fields B1 to B4 that are respectively created in the quadrants Q1 to Q4 therefore cancel out toward the outside in terms of their effect. The reference coil therefore has a very short range and it barely reacts to a target approach.

The difference of measured values for the signal coil and the reference coil or the assigned oscillating circuits therefore forms the actual measurement signal, which is independent of external interference values, as these act in the same way on both coils and are therefore compensated by the formation of the difference.

As in the exemplary embodiment, air-core coils without a ferrite core are used, higher oscillation frequencies are achieved and the same switching distances are possible for all metals that are to be detected (factor 1).

Due to the application of the difference principle only the signal caused by the approaching target is evaluated, while disturbances are suppressed. This results in good stability with respect to temperature changes and interferences caused by electromagnetic waves (electromagnetic compatibility, "EMC interferences").

The circuit design and coil design are very simply configured, so production can take place inexpensively. The design of the proximity switch and the coils according to the present disclosure allows a robust design and as a result also lower return rates in manufacturing. Furthermore, lower requirements are placed on tolerances during manufacturing than for alternative methods.

The proximity switch can be produced with little hardware outlay and therefore inexpensively.

LIST OF REFERENCE SIGNS

10, 20, 30, 40 Step
100 Proximity switch

102 Signal coil
104 Reference coil
106 Multiplexer circuit
108 Driver circuit, differential oscillator
110 Operational amplifier
112 Detection module, microcontroller
114 "Gate time" square wave signal
116 Logical AND operation
118 Evaluation module
120 Control unit
122 Voltage regulator
124 Output driver
126 Detection zone
128 Target
130 Capacitor
200 Shield grid
310 Signal coil (front side)
320 Signal coil (rear side)
410 Reference coil (front side)
420 Reference coil (rear side)
500 Grid with coil terminals
510 Terminal
610 Reference coil (front side)
620 Reference coil (rear side)
630 Coil input (reference coil)
640 Coil output (reference coil)
710 Signal coil (front side)
720 Signal coil (rear side)
730 Coil input (signal coil)
740 Coil output (signal coil)
750 Center point
800 Reference coil
a Distance
B1, B2, B3, B4 Magnetic field (direction)
d Diameter
$I_S, I_{S1}, I_{S2}, I_{S3}, I_{S4}$ Current (direction)
n Number, number of turns
Q1, Q2, Q3, Q4 Sub-winding, quadrant

What is claimed is:

1. An inductive proximity switch comprising:
a signal oscillating circuit and a reference oscillating circuit;
a multiplexer circuit designed to alternately activate the signal oscillating circuit and the reference oscillating circuit;
a driver circuit having an oscillator designed to operate the activated signal oscillating circuit and the activated reference oscillating circuit with an oscillator frequency, respectively;
a detection module designed to determine a number of oscillations of the activated signal oscillating circuit measured within a predetermined gate time and a number of oscillations of the activated reference oscillating circuit measured within the predetermined gate time; and
an evaluation module designed to determine a difference signal on basis of the determined number of oscillations of the activated signal oscillating circuit measured within the predetermined gate time and the determined number of oscillations of the activated reference oscillating circuit measured within the predetermined gate time, and to generate a control signal depending on the difference signal; wherein
the signal oscillating circuit is designed such that the oscillation parameter for the signal oscillating circuit depends on a position of a target in a detection zone;
the reference oscillating circuit is designed such that the oscillation parameter for the reference oscillating circuit is essentially independent of the position of the target in the detection zone;
the signal oscillating circuit includes a signal coil and the reference oscillating circuit includes a reference coil;
the reference coil has a plurality of sub-windings and the sub-windings are designed in a counter-wound manner with respect to one another; and
the reference coil has four sub-windings or a whole-number multiple of four sub-windings.

2. The inductive proximity switch according to claim 1, wherein
the signal coil and the reference coil have essentially a same inductance.

3. The inductive proximity switch according to claim 1, wherein
the signal coil and the reference coil are an air-core coil without a ferrite core, respectively.

4. The inductive proximity switch according to claim 1, wherein
the multiplexer circuit is configured to activate the signal oscillating circuit to turn on a connection, so that a capacitor and the signal coil form the signal oscillating circuit, and to activate the reference oscillating circuit to turn on a connection, so that the capacitor and the reference coil form the reference oscillating circuit.

5. The inductive proximity switch according to claim 1, wherein
the signal coil is a cylindrically wound coil.

6. The inductive proximity switch according to claim 1, wherein
the signal coil is a planar coil.

7. The inductive proximity switch according to claim 1, wherein
the reference coil is a planar coil.

8. The inductive proximity switch according to claim 1, wherein
the counter-wound sub-windings are designed such that high frequency fields generated by the sub-windings substantially cancel themselves out in the activated reference oscillating circuit.

9. The inductive proximity switch according to claim 8, wherein
the high frequency fields are induced magnetic fields.

10. The inductive proximity switch according to claim 1, wherein
the signal coil and the reference coil are flat and arranged in layers above one another.

11. The inductive proximity switch according to claim 1, wherein
at least one grid layer is provided, the at least one grid layer having the signal coil and the reference coil arranged above one another.

12. The inductive proximity switch according to claim 11, wherein
the at least one grid layer is designed for shielding in the sense of electromagnetic compatibility of the inductive proximity switch.

13. The inductive proximity switch according to claim 11, wherein
the at least one grid layer includes a first grid layer being arranged above the signal coil and the reference coil and a second grid layer being arranged below the signal coil and the reference coil.

14. An inductive proximity switch comprising:
a signal oscillating circuit and a reference oscillating circuit;
a multiplexer circuit designed to alternately activate the signal oscillating circuit and the reference oscillating circuit;
a driver circuit having an oscillator designed to operate the activated signal oscillating circuit and the activated reference oscillating circuit with an oscillator frequency, respectively;
a detection module designed to detect an oscillation parameter of the activated signal oscillating circuit and an oscillation parameter of the activated reference oscillating circuit, respectively; and
an evaluation module designed to determine a difference signal on basis of the oscillation parameter of the activated signal oscillating circuit and the oscillation parameter of the activated reference oscillating circuit and to generate a control signal depending on the difference signal; wherein
the signal oscillating circuit is designed such that the oscillation parameter for the signal oscillating circuit depends on a position of a target in a detection zone;
the reference oscillating circuit is designed such that the oscillation parameter for the reference oscillating circuit is essentially independent of the position of the target in the detection zone;
the oscillation parameter relates to an amplitude of the activated oscillating circuit;
the signal oscillating circuit includes a signal coil and the reference oscillating circuit includes a reference coil;
the reference coil has a plurality of sub-windings and the sub-windings are designed in a counter-wound manner with respect to one another; and
the reference coil has four sub-windings or a whole-number multiple of four sub-windings.

15. An inductive proximity switch comprising:
a signal oscillating circuit and a reference oscillating circuit;
a multiplexer circuit designed to alternately activate the signal oscillating circuit and the reference oscillating circuit;
a driver circuit having an oscillator designed to operate the activated signal oscillating circuit and the activated reference oscillating circuit with an oscillator frequency, respectively;
a detection module designed to detect an oscillation parameter of the activated signal oscillating circuit and an oscillation parameter of the activated reference oscillating circuit, respectively; and
an evaluation module designed to determine a difference signal on basis of the oscillation parameter of the activated signal oscillating circuit and the oscillation parameter of the activated reference oscillating circuit and to generate a control signal depending on the difference signal; wherein
the signal oscillating circuit is designed such that the oscillation parameter for the signal oscillating circuit depends on a position of a target in a detection zone;
the reference oscillating circuit is designed such that the oscillation parameter for the reference oscillating circuit is essentially independent of the position of the target in the detection zone,
the signal oscillating circuit includes a signal coil and the reference oscillating circuit includes a reference coil,
the signal coil and the reference coil have essentially the same inductance,
the reference coil has four sub-windings or a whole-number multiple of four sub-windings,
the counter-wound sub-windings are designed such that high frequency fields generated by the sub-windings substantially cancel themselves out in the activated reference oscillating circuit.

\* \* \* \* \*